(12) United States Patent
Carter et al.

(10) Patent No.: US 7,294,390 B2
(45) Date of Patent: Nov. 13, 2007

(54) METHOD FOR IMPROVING THE THERMAL CYCLED ADHESION OF THICK-FILM CONDUCTORS ON DIELECTRIC

(75) Inventors: Bradley H. Carter, Kokomo, IN (US); Lynda G. Flederbach, Kokomo, IN (US); John K. Isenberg, Rossville, IN (US)

(73) Assignee: Delphi Technologies, Inc., Troy, MI (US)

( * ) Notice: Subject to any disclaimer, the term of this patent is extended or adjusted under 35 U.S.C. 154(b) by 106 days.

(21) Appl. No.: 11/111,317

(22) Filed: Apr. 21, 2005

(65) Prior Publication Data

US 2006/0240231 A1    Oct. 26, 2006

(51) Int. Cl.
*B32B 3/00*   (2006.01)
*H05K 1/00*   (2006.01)

(52) U.S. Cl. ........................................ 428/209; 174/257
(58) Field of Classification Search ................ 428/209, 428/210; 174/257
See application file for complete search history.

(56) References Cited

U.S. PATENT DOCUMENTS

| | | | | |
|---|---|---|---|---|
| 3,583,931 A | | 6/1971 | Bouchard | |
| 4,424,251 A | * | 1/1984 | Sugishita et al. | ............ 428/209 |
| 5,264,156 A | * | 11/1993 | Gora et al. | ............ 252/519.13 |
| 5,480,835 A | * | 1/1996 | Carney et al. | ............... 438/614 |
| 5,518,663 A | | 5/1996 | LaBranche et al. | |
| 5,645,765 A | * | 7/1997 | Asada et al. | ............ 252/519.51 |
| 5,786,288 A | * | 7/1998 | Jean | ............................ 501/16 |
| 5,821,181 A | * | 10/1998 | Bethke et al. | ................. 501/8 |
| 6,159,883 A | * | 12/2000 | Lin et al. | ....................... 501/32 |
| 6,362,435 B1 | * | 3/2002 | Downey et al. | ............ 174/260 |

\* cited by examiner

*Primary Examiner*—Cathy F. Lam
(74) *Attorney, Agent, or Firm*—Jimmy L. Funke

(57) ABSTRACT

An improved electrical printed circuit exhibiting a combination of enhanced solderability and outstanding adhesion with a dielectric substrate includes a stack of two different types of conductive films. The stack includes a first conductive film that is printed onto the substrate with an ink that has been specially formulated to achieve enhanced adhesion with the substrate, and a second film that is applied over the first film using an ink that has been specifically formulated to achieve enhanced solderability.

4 Claims, 1 Drawing Sheet

METHOD FOR IMPROVING THE THERMAL CYCLED ADHESION OF THICK-FILM CONDUCTORS ON DIELECTRIC

FIELD OF THE INVENTION

This invention relates to multiple layer hybrid circuits and more particularly to a thick-film conductor that exhibits improved thermal cycled adhesion to a dielectric material.

BACKGROUND OF THE INVENTION

Industry requirements for thermal cycled adhesion of multiple layer hybrid circuits are becoming increasingly more demanding. The currently accepted industry practice is to use a silver/palladium ink or other conductive ink having a high silver content, which is printed on a dielectric substrate either in a single or double layer. A double layer is preferred because it reduces the chances of cracks or openings developing in the circuit, and increases the conductor thickness, thereby providing enhanced durability and performance. However, the resulting circuit has a limited thermal cycle life due to delamination or loss of adhesion of the conductor from the underlying dielectric layer.

It would be desirable to achieve improved adhesion of the printed circuit to the dielectric layer without substantially altering or complicating currently used manufacturing techniques. In particular, it would be highly desirable to achieve improved adhesion of the printed circuit to the substrate dielectric material without employing additional fabrication steps, and without requiring additional manufacturing equipment.

SUMMARY OF THE INVENTION

The invention employs a stack of two different types of conductor inks, each having a high silver content, with the ink applied directly to the dielectric being specifically selected to achieve an improved thermal cycled adhesion, and with the other ink having excellent solderability.

These and other features, advantages and objects of the present invention will be further understood and appreciated by those skilled in the art by reference to the following specification, claims and appended drawing.

DESCRIPTION OF THE PREFERRED EMBODIMENT

Figure 1:
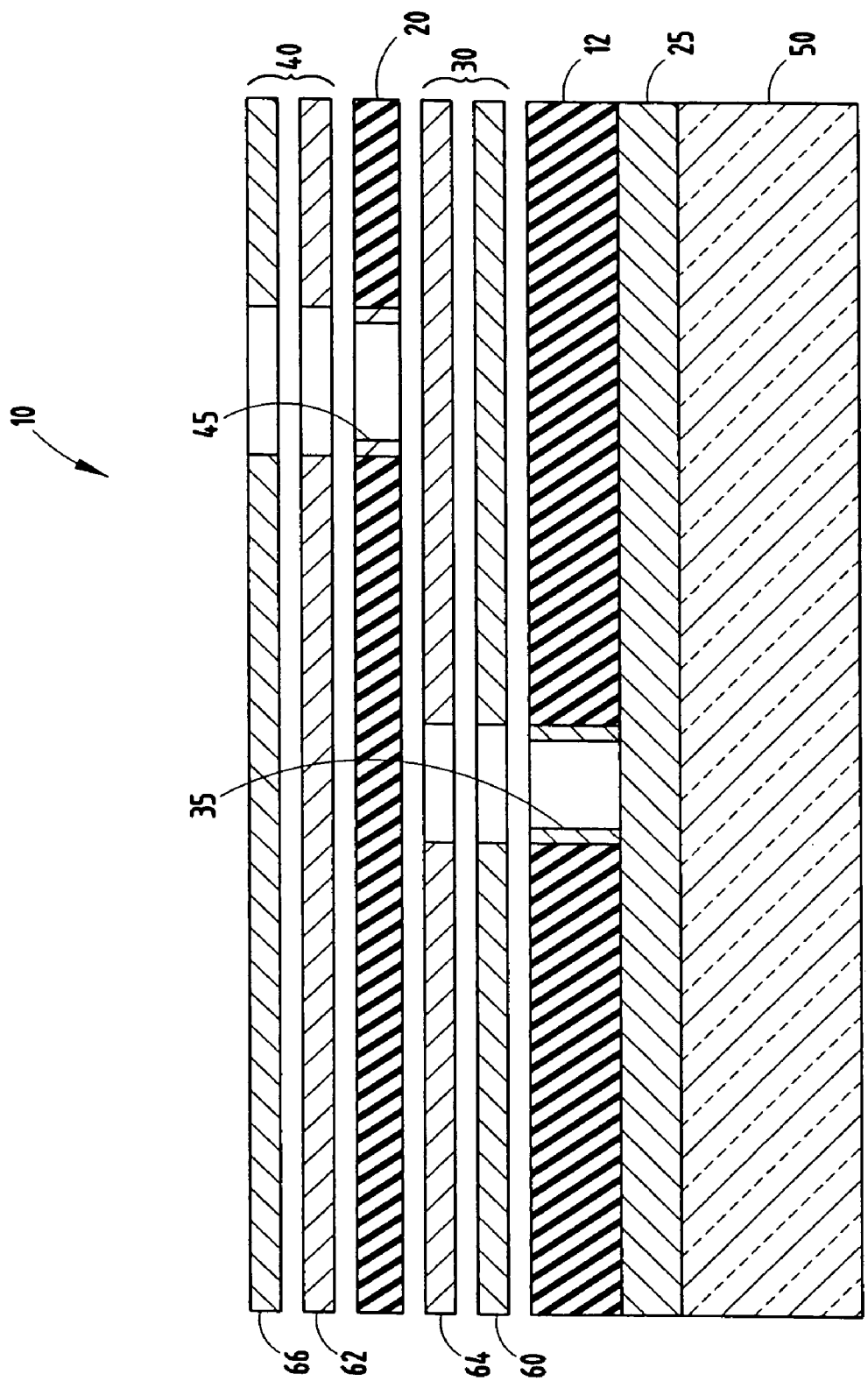
FIG. 1 is a schematic illustration of a multiple layer circuit device in accordance with the principles of the invention, wherein certain of the individual layers are shown separated from other layers only for the purpose of facilitating an understanding of the invention, it being understood that conductive layers are directly and tenaciously adhered to an underlying adjacent layer.

FIG. 1 shows a multiple layer hybrid circuit device 10 in accordance with the principles of the invention. Circuit device 10 includes an electrically non-conductive or base dielectric layer 12 on which a plurality of layered circuits are stacked. Each circuit in the stack (two of which are shown) is separated by a dielectric layer 20. Base dielectric layer 12 is disposed on a ground plane conductor 25. A first circuit layer 30 can be electrically connected to ground plane conductor 25 by a conventional via 35 which extends through base dielectric layer 12. Via 35 is typically prepared by providing dielectric layer 12 with an opening that extends completely through base dielectric layer 12 and which is plated or coated with a conductive material, which is typically a metal such as silver, gold or copper.

First circuit layer 30 and a second circuit layer 40 can be electrically connected by a via 45 in dielectric separation layer 20. Via 45 is generally similar to via 35. The stack of circuits may include additional layers (not shown). However, the invention is adequately illustrated by the specifically disclosed embodiment having only two layers. As is typically the case, ground plane conductor 25 is attached to a ceramic substrate 50.

Suitable ceramic substrate materials include aluminum oxide, silicon dioxide, barium oxide, and aluminum nitride. Suitable materials for ground plane conductor 25 include various metal layers such as gold, silver, copper, and aluminum. Base dielectric layer 12 and any additional dielectric separating layer 20 is typically comprised of an insulating oxide such as silicon dioxide or alumina ($Al_2O_3$).

Each of the first and second circuit layers 30 and 40 is comprised of two different layers of conductive ink, including a high adhesion conductor ink layer 60, 62 and a highly solderable conductor ink layer 64, 66.

A conductor ink composition suitable for printing thick-film circuits on dielectric materials comprises a mixture of noble metals (e.g., silver and platinum), inorganic binders (e.g., glass or glass-forming materials), and an organic medium or solvent used to form a combination of the noble metals and inorganic binders, and has a paste-like consistency, which can be screen printed or otherwise applied onto a substrate. After the conductor ink composition has been screen printed or otherwise applied to a substrate, it is then dried and fired (heated at high temperature) to volatilize the organic medium and sinter the binders.

In accordance with the principles of the invention, conductive ink layers 60 and 62 are formulated to exhibit enhanced adhesion with a dielectric substrate, and conductive ink layers 64 and 66 are formulated to achieve enhanced solderability, which is a desirable property because of the necessity of connecting the conductive pattern with other components of an electronic system, e.g., resistor and capacitor networks, resistors, potentiometers, chip resistors, chip capacitors, chip carriers and the like.

Each of the conductive ink layers 60, 62, 64 and 66 comprises from about 50% to about 95% by weight of solids (i.e., noble metals, their alloys or mixtures thereof, and inorganic binders, such as glass particles and/or glass-forming particulate materials). The amount of conductive metal in the conductive ink used to form layers 60, 62, 64 and 66 is in the range of from about 60% to about 99% of the total solids in the composition. The amount of binder is about 1-40% of the total solids in the composition. The balance of the ink composition used to form conductive layers 60, 62, 64 and 66 (5-50% by weight) is comprised of an organic medium.

Any of the noble metals, their alloys or mixtures thereof may be used, including silver, gold, platinum, palladium, alloys of platinum and gold, palladium and silver, palladium and gold, platinum and silver, platinum/palladium/gold and platinum/palladium/silver. A preferred noble metal alloy comprises about 95%-100% silver and up to about 5% platinum.

Suitable inorganic binders are those conventional materials which upon sintering serves to bind metal to ceramic substrates, such as glasses, certain metal oxides and glass precursors. Conventional glass frits such as lead borates, lead silicates, lead borosilicates, cadmium borate, lead cadmium borosilicates, zinc borosilicates, sodium cadmium borosilicates, bismuth silicates, bismuth borosilicates, bismuth lead silicates, and bismuth lead borosilicates may be employed.

The glass binders are typically prepared by employing conventional glass making techniques, by mixing the desired components (or precursors thereof, e.g., $H_3BO_3$) in the desired portions and heating the mixture to form a melt. As is well known in the art, heating is conducted to a peak temperature and for a time such that the melt becomes entirely liquid, yet gaseous evolution has ceased. The melt is then quenched by cooling the melt, typically by pouring into a cold belt or into cold running water. Particulate size reduction can then be accomplished by milling as desired.

The inorganic binder can also contain up to approximately four parts by weight basis paste of a pyrochlore-related oxide. Suitable pyrochlore materials are well known in the art, and are discussed in U.S. Pat. Nos. 5,518,663 and 3,583,931.

Layers 60 and 62, which are formulated to exhibit enhanced adhesion may also contain a crystalline adhesion promoter from the feldspar family.

The desired adhesion properties may be achieved by selecting from a range of compositions of the type $[M_a^{1+}]_x[M_b^{2+}]_{1-x}Al_{2-x}Si_{2+x}O_8$, where $M_a$ typically can be potassium (K) or sodium (Na), and $M_b$ typically is calcium (Ca) and x is 0-1. Such materials are familiar to the ceramics industry, and are additionally described in the literature. Similarly, it is believed that trivalent ions ($M_c$) such as bismuth, can be substituted for divalent calcium by charge compensating with Al/Si, e.g., $[M_c^{3+}]_x[M_b^{2+}]_{1-x}Al_{2-1}Si_{2+x}O_8$.

In addition to these anorthite-structural derivatives, other Ca—Al—Si—O phases exist, such as gehlenite, $Ca_2Al_2SiO_7$. Gehlenite also has a wide range of substitutional capability, e.g., $[M_d]_2[M_e][M_f]_2O_7$ wherein $M_d$ is selected from the group Ca and Na, and $M_e$ is selected from the group Mg and Al, and $M_f$ is selected from the group Si and Al.

The crystalline structure additive belongs to the feldspar family, which has a wide range of possible substitutions. For instance, similar benefits for adhesion are anticipated if a potash feldspar (microcline or orthoclase) $K(AlSi_3)O_8$ is used instead of a lime feldspar (anorthite) in the present invention. Similarly, it is expected that the soda feldspar (albite) $Na(AlSi_3)O_8$ could be used instead of a lime feldspar with a similar beneficial effect on conductor adhesion.

Suitable ink compositions formulated for achieving excellent adhesion with a dielectric substrate contain about 1% to about 10% by weight of an anorthite additive or other suitable adhesion promoter based on the total solids content. The dried, fired film typically contains from about 1% to about 20% of adhesion promoter by weight. The anorthite additive imparts higher conductor aged adhesion. With the present invention, relatively higher amounts of anorthite additive may be utilized in layers 60 and 62 to achieve excellent adhesion, without concern of also reducing solderability, since a second layer formulated to achieve excellent solderability, without anorthite additives is formed over the first layers 60 and 62.

The solids of the conductive ink formulated for enhanced solderability do not contain an effective amount of adhesion promoter. Typically, the enhanced-solderability conductive ink composition does not contain any adhesion promoter, and in any case includes less adhesion promoter than the high-adhesion conductive ink composition.

Essentially any inert liquid or gel may be used as or in the vehicle in the paste-like ink composition used for forming layers 60, 62, 64 and 66. Examples of organic liquids which can be used are aliphatic alcohols, esters of such alcohols (e.g., acetates and propionates), terpenes such as pine oil, terpineol and the like, solutions of resins such as the polymethacrylates of lower alcohols and solution of ethyl cellulose in solvents such as pine oil and the monobutyl ether of ethylene glycol monoacetate.

The paste-like conductive inks are conveniently prepared on a roll mill.

Circuit devices in accordance with the invention are prepared by applying a first conductive ink formulated for exhibiting enhanced adhesion on a dielectric substrate in a desired circuit path, drying and optionally firing the printed substrate at a temperature and for a time sufficient to volatilize the organic medium and sinter the binder in the ink to form a first conductive layer, applying a second conductive ink formulated for exhibiting excellent solderability over the first conductive layer and firing to form a second conductive layer over the first conductive layer.

The resulting device has stacked printed conductive layers including a first layer exhibiting outstanding adhesion (but possibly poor solderability), and a second layer exhibiting outstanding solderability (but possibly lower adhesion to a dielectric). The adhesivity of the exposed or second layer is irrelevant to its function, and the solderability of the first layer sandwiched between the dielectric substrate and the second conductive layer is irrelevant to its function. The primary difference between a first conductive ink that is formulated for good adhesion with a dielectric and a second conductive ink that is formulated for good solderability is that the first ink contains an amount of an adhesion promoting substrate that is effective to provide improved adhesion to a dielectric, whereas the second ink does not contain an effective amount of an adhesion promoter.

The above description is considered that of the preferred embodiments only. Modifications of the invention will occur to those skilled in the art and to those who make or use the invention. Therefore, it is understood that the embodiment shown in the drawings and described above are merely for illustrative purposes and are not intended to limit the scope of the invention, which is defined by the following claims as interpreted according to the principles of patent law, including the doctrine of equivalents.

The invention claimed is:

1. An electrical printed circuit comprising:
   a dielectric substrate; and
   a circuit pattern adhered to the dielectric substrate, the circuit pattern including a first layer bonded to the dielectric substrate and a second layer applied to the first layer, the first layer comprising, by weight, from about 60% to about 99% noble metal and about 1% to about 20% of an adhesion promoter effective to enhance adhesion to the dielectric substrate, the second layer comprising, by weight, from about 60% to about 99% noble metal and being substantially free of the adhesion promoter, said second layer exhibiting enhanced solderability.

2. The electrical circuit device of claim 1, wherein the adhesion promoter is a crystalline feldspar material.

3. The electrical circuit device of claim 1, wherein the adhesion promoter is of a formula selected from the group consisting of $[M_a^{1+}]_x[M_b^{2+}]_{1-x}Al_{2-x}Si_{2+x}O_8$, $[M_c^{3+}]_x[M_b^{2+}]_{1-x}Al_{2+x}Si_{2-x}O_8$, and $[M_d]_2[M_e][M_f]_2O_7$; wherein $M_a$ is K or Na, $M_b$ is Ca, $M_c$ is Bi, Fe, Mn, Cr, V, Sc, In, Y, Gd, Eu, Sm, Nd, Pr, Ce, La, or Sb, $M_d$ is Ca or Na, $M_e$ is Mg or Al, $M_f$ is Si or Al.

4. The electrical circuit device of claim 1 wherein the noble metals comprise about 95% to 100% silver and up to about 5% platinum.

* * * * *